(12) United States Patent
Zhou et al.

(10) Patent No.: US 8,460,012 B2
(45) Date of Patent: Jun. 11, 2013

(54) SOCKET PROTECTION DEVICE AND CIRCUIT BOARD ASSEMBLY

(75) Inventors: Hai-Qing Zhou, Shenzhen (CN); Yi-Xin Tu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/314,191

(22) Filed: Dec. 8, 2011

(65) Prior Publication Data

US 2013/0029506 A1    Jan. 31, 2013

(30) Foreign Application Priority Data

Jul. 26, 2011    (CN) ........................ 2011 1 0210527

(51) Int. Cl.
*H01R 12/00*    (2006.01)

(52) U.S. Cl.
USPC ............................................. 439/73; 439/331

(58) Field of Classification Search
USPC .................................................... 439/73, 331
See application file for complete search history.

(56) References Cited

U.S. PATENT DOCUMENTS

| | | | |
|---|---|---|---|
| 6,957,973 B1* | 10/2005 | McHugh et al. | 439/331 |
| 7,033,198 B2* | 4/2006 | Chiang | 439/331 |
| 7,247,043 B2* | 7/2007 | Lai | 439/331 |
| 7,438,580 B1* | 10/2008 | Aoki et al. | 439/331 |
| 7,658,633 B1* | 2/2010 | Terhune et al. | 439/331 |
| 7,717,731 B2* | 5/2010 | Liao | 439/331 |
| 7,819,688 B2* | 10/2010 | Terhune et al. | 439/331 |
| 7,845,964 B2* | 12/2010 | Fan | 439/331 |
| 7,896,677 B2* | 3/2011 | Fan | 439/331 |
| 8,162,685 B2* | 4/2012 | Tang et al. | 439/331 |
| 8,233,284 B2* | 7/2012 | Ju et al. | 361/753 |
| 2004/0058567 A1* | 3/2004 | Ma | 439/73 |
| 2006/0116007 A1* | 6/2006 | Ma | 439/73 |
| 2007/0049066 A1* | 3/2007 | Ju | 439/73 |
| 2007/0134950 A1* | 6/2007 | Huang | 439/73 |
| 2007/0173081 A1* | 7/2007 | Yu et al. | 439/73 |
| 2008/0057751 A1* | 3/2008 | Zhang | 439/73 |
| 2009/0170350 A1* | 7/2009 | Xu et al. | 439/73 |
| 2009/0325403 A1* | 12/2009 | Yeh | 439/73 |
| 2010/0330824 A1* | 12/2010 | Ulen et al. | 439/73 |
| 2011/0230063 A1* | 9/2011 | Tang et al. | 439/55 |
| 2011/0273842 A1* | 11/2011 | Kyle et al. | 361/679.54 |
| 2013/0029506 A1* | 1/2013 | Zhou et al. | 439/136 |

* cited by examiner

*Primary Examiner* — Ross Gushi
(74) *Attorney, Agent, or Firm* — Altis Law Group, Inc.

(57) ABSTRACT

A socket protection device includes a fixing member, a cover, a limiting member, and an operation member. The fixing member is secured to a circuit board. The fixing member includes a pair of first connecting blocks. The cover includes a second connecting block, a first latching portion, and a second latching portion. The limiting member is secured to the circuit board. The operation member includes a shaft and an operation rod secured to the shaft. The shaft rotatably connects the cover to the fixing member via the first and second connecting blocks. When the operation rod is pressed to drive the shaft to rotate, the cover is rotated toward the socket. When the cover covers the socket, the first latching portion latches the limiting member, and the second latching portion latches the operation rod.

16 Claims, 3 Drawing Sheets

SOCKET PROTECTION DEVICE AND CIRCUIT BOARD ASSEMBLY

BACKGROUND

1. Technical Field

The present disclosure relates to socket protection devices and, particularly, to a socket protection device for preventing pins of a socket from being bent and a circuit board assembly using the socket protection device.

2. Description of Related Art

Typically, a central processing unit (CPU) socket includes a number of pins to electrically connect the CPU socket to a CPU inserted thereon. During testing the CPU socket, the CPU socket needs to undergo test from several workstations. As the pins of the CPU socket are exposed outside, the pins are likely to bend when the CPU socket is transferred from one workstation to the next workstation. Therefore, it would be desired to provide a protection device for protecting pins of CPU sockets.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
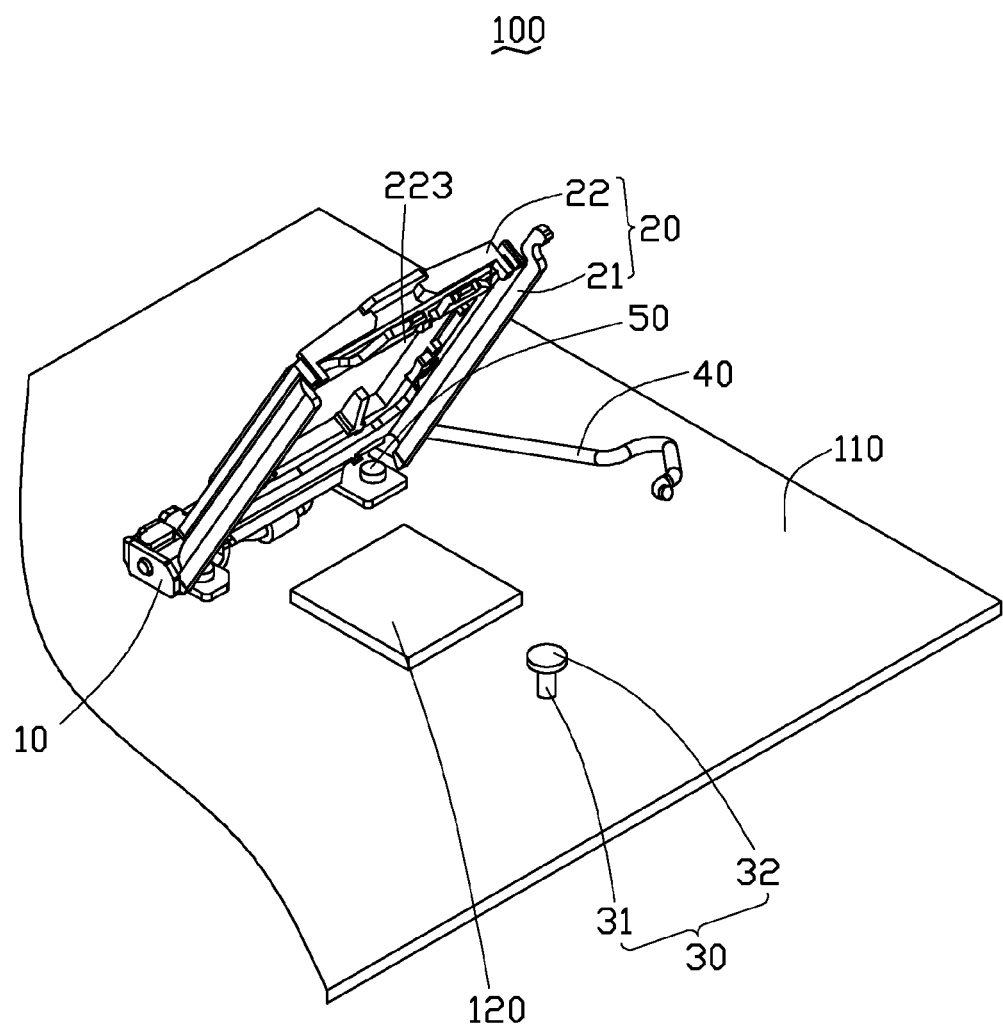
FIG. 1 is an isometric view showing a socket protection device mounted on a circuit board, in accordance with an exemplary embodiment.
Figure 2:
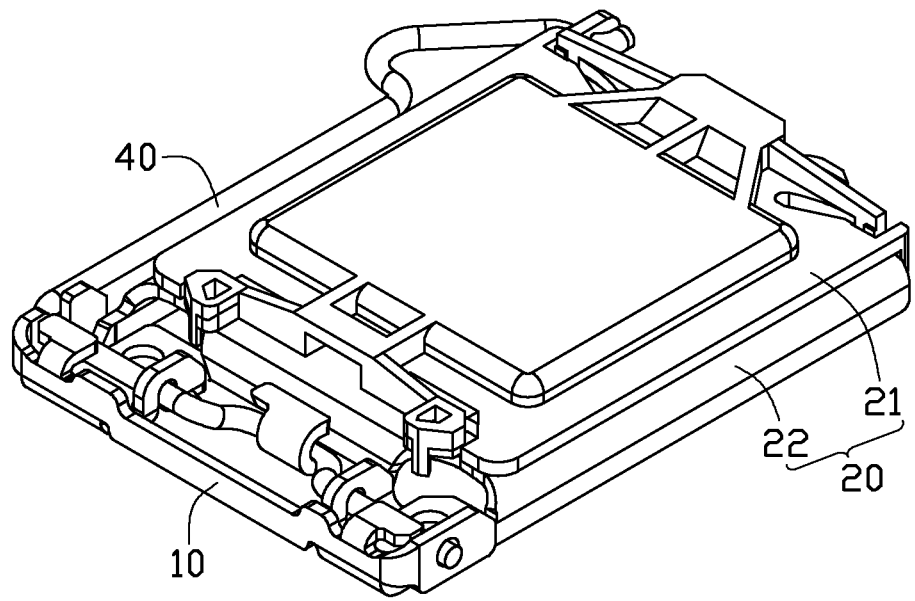
FIG. 2 is an isometric view of the socket protection device of FIG. 1.
Figure 3:
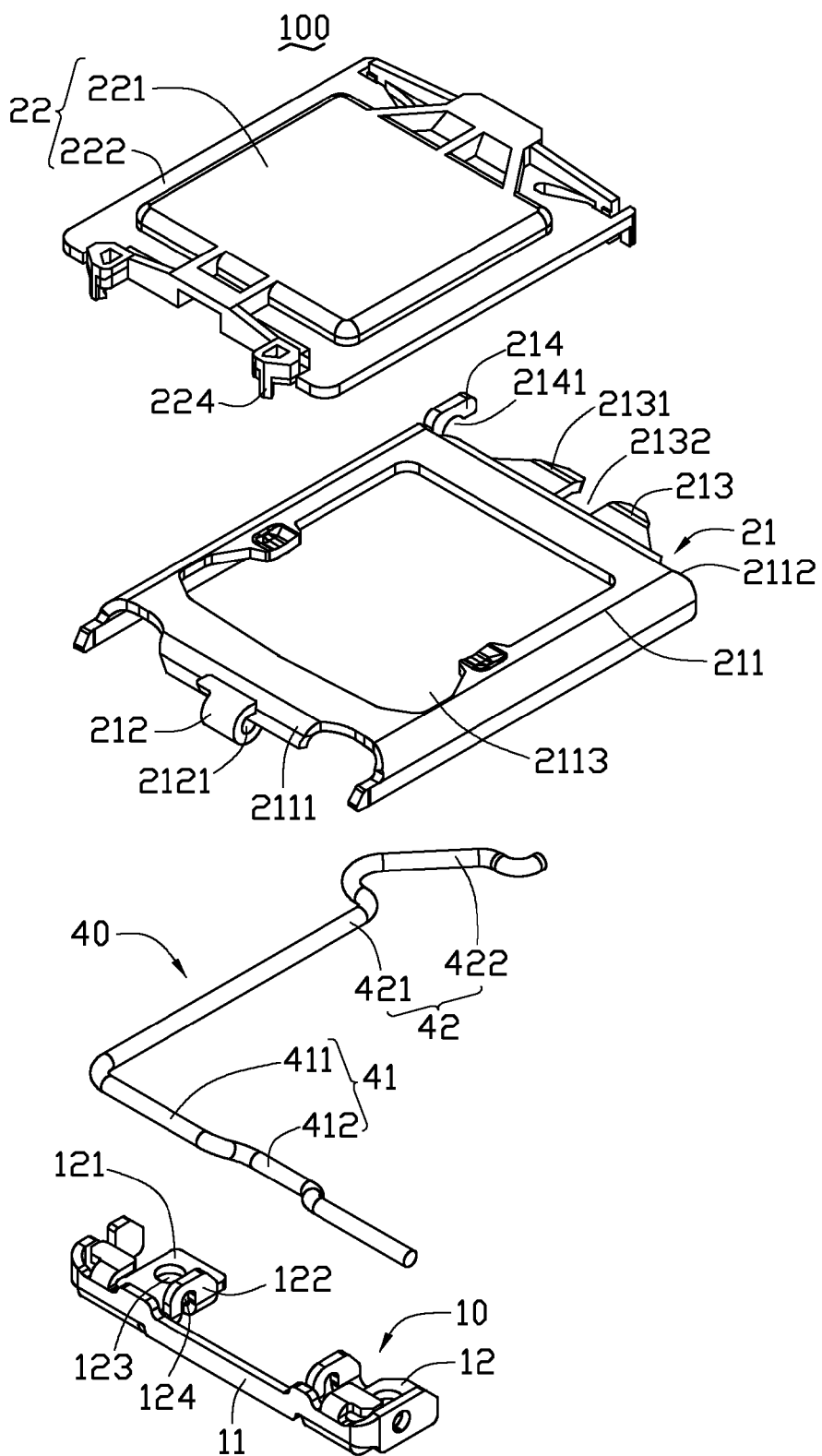
FIG. 3 is an exploded, perspective view of the socket of FIG. 1.

Referring to FIGS. 1-3, an embodiment of a socket protection device 100 is illustrated. The device 100 is to protect a socket 120 mounted on a circuit board 110. In the embodiment, the socket 120 is a CPU socket including a number of metal pins (not shown). The device 100 includes a fixing member 10, a cover 20, a limiting member 30, an operation member 40, and a number of screws 50. The circuit board 110 defines a number of through holes (not shown) for fixing the limiting member 30 and the screws 50.

The fixing member 10 includes a fixing plate 11 and two bases 12 secured to the fixing plate 11. Each base 12 includes a positioning block 121 and a connecting block 122 perpendicular to the positioning block 121. Each positioning block 121 extends toward a direction perpendicular to an extension direction of the fixing plate 11. Each positioning block 121 defines a fixing hole 123 cooperating with one through hole of the circuit board 110 to receive one screw 50. The connecting blocks 122 are arranged between the positioning blocks 121. Each connecting block 122 defines a shaft hole 124. The shaft holes 124 are coaxial to each other, and the axes of the shaft holes 124 are parallel to the extension direction of the fixing plate 11.

The cover 20 includes a first cover 21 and a second cover 22 detachably latched to the first cover 21. The first cover 21 is made of metal. The first cover 21 includes a main body 211, at least one connecting block 212, a first latching portion 213, and a second latching portion 214. The main body 211 includes a front end 2111 and a back end 2112 opposite to the front end 2111. The main body 211 defines a receiving space 2113 extending through thereto. The connecting block 212 is substantially arranged at the center of the front end 2111. The connecting block 212 defines a shaft hole 2121. The latching portions 213, 214 are arranged on the back end 2112. The latching portion 213 includes two latching blocks 2131. The latching blocks 2131 are spaced from each other to form a latching slot 2132. The latching portion 214 is arranged at a corner of the main body 211. An end of the latching portion 214 adjacent to the main body 211 is bent to form a latching slot 2141 opposite to the second cover 22.

The second cover 22 is made of plastic. The second cover 22 includes a protection portion 221 and a flange 222 surrounding the protection portion 221. The protection portion 221 protrudes toward a direction opposite to the first cover 21 to form a recess 223 (see FIG. 1). The shape and size of the recess 223 are substantially the same as the receiving space 2113. A number of latching blocks 224 protrudes from the flange 222 to latch the second cover 22 to the first cover 21.

The limiting member 30 is secured to the circuit board 110. The limiting member 30 includes a first rod 31 secured to the circuit board 110 and a second rod 32 secured to the first rod 31. The diameter of the first rod 31 is less than that of the second rod 32. The width of the latching slot 2132 is greater than the diameter of the first rod 31 and less than the diameter of the second rod 32.

The operation member 40 is made of metal. The operation member 40 includes a shaft 41 and an operation rod 42 substantially perpendicular to an end of the shaft 41. The shaft 41 includes two first shaft portions 411 and a second shaft portion 412 arranged between the two first shaft portions 411. The two first shaft portions 411 are arranged in a first straight line, and the second shaft portion 412 is in a second straight line parallel to the first straight line. The extension direction of the second shaft portion 412 is parallel to the extension direction of the two first shaft portions 411. The operation rod 42 includes a connecting portion 421 secured to an end of one first shaft portion 421 away from the second shaft portion 412, and a free portion 422 secured to the connecting portion 421. The two first shaft portions 411, the second shaft portion 412, the connecting portion 421, and the free portion 422 are substantially coplanar with each other. The second shaft portion 412 is nearer to the free portion 422 than the first shaft portions 411.

In assembly, the screws 50 pass through the fixing holes 123 of the positioning blocks 121 and the through holes of the circuit board 110, to secure the fixing member 10 to the circuit board 110 adjacent to a sidewall of the socket 120. The limiting member 30 is secured to the circuit board 110 and adjacent to an opposite sidewall of the socket 120. The shaft 41 passes through one shaft hole 124, the shaft hole 2121, and the other shaft hole 124 in sequence to cause the first cover 21 to be rotatably connected to the fixing member 10. At this point, the second cover 22 is placed on the first cover 21, and the latching blocks 224 cooperate with the flange of the first cover 21 to detachably latch the second cover 22 to the first cover 21.

In use, the operation rod 42 is pressed to drive the shaft 41 to rotate, and the rotation of the shaft 41 drives the cover 20 to rotate toward the socket 120 until the cover 20 covers the socket 120. During the cover 20 is rotated toward the socket 120, the latching slot 2132 gradually approaches the limiting member 30. The width of the latching slot 2132 is greater than the diameter of the first rod 31 and less than the diameter of the second rod 32, thus when the cover 20 covers the socket 120, the latching slot 2132 engages the first rod 31, and the vertical movement of the cover 20 is limited by the second rod 32 to fix the cover 20. Furthermore, when the cover 20 covers the socket 120, the latching slot 2141 latches the free portion 422 of the operation rod 42 to fix the operation member 40. Thus, the device 100 can prevent the pins of the socket 120 from being bent when the socket 120 is transferred from one workstation to the next workstation.

If a CPU is needed to test the socket 120, the cover 20 is operated to move opposite to the socket 120 until there is enough space for an operator to insert the CPU onto the socket 120. When the CPU is inserted onto the socket 120, the operation rod 42 is pressed to drive the cover 20 to rotate toward the socket 120 until the second cover 22 is resisted by the CPU. As the second cover 22 is detachably latched to the first cover 21, the second cover 22 can be resisted by the CPU to disengage from the first cover 21. At this point, the CPU is exposed outside via the receiving space 2113, and the socket 120 can be tested. After the test has been finished, the CPU is pulled out of the socket 120. The second cover 22 is then latched to the first cover 21 to protect the socket 120.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A socket protection device comprising:
a fixing member to be secured to a circuit board and adjacent to a sidewall of a socket on the circuit board, the fixing member comprising a pair of first connecting blocks parallel to each other, each of the first connecting blocks defining a first shaft hole;
a cover comprising a first cover rotatably connected to the fixing member, a second cover detachably latched to the first cover, a second connecting block defining a second shaft hole, and a first latching portion and a second latching portion which are arranged opposite to the second connecting block;
a limiting member to be secured to the circuit board and opposite to the fixing member across of the socket; and
an operation member comprising a shaft and an operation rod perpendicular secured to the shaft, the shaft passing through one of the first shaft holes, the second shaft hole, and the other one of the first shaft holes in sequence to rotatably connect the cover to the fixing member;
wherein, when the operation rod is pressed to drive the shaft to rotate, the cover is rotated toward the socket by the rotation of the shaft, when the cover covers the socket, the first latching portion latches the limiting member, and the second latching portion latches the operation rod.

2. The socket protection device as described in claim 1, wherein the first cover defines a receiving space extending through the first cover, the first receiving space is to expose the socket when the first cover covers the socket.

3. The socket protection device as described in claim 2, wherein the second cover comprises a protection portion and a flange surrounding the protection portion, the protection portion protrudes toward a direction opposite to the first cover to form a recess, the shape of the recess is substantially the same as that of the receiving space.

4. The socket protection device as described in claim 3, wherein the shaft comprises two first shaft portions and a second shaft portion arranged between the first shaft portions, the first shaft portions are in a first straight line, and the second shaft portion is in a second straight line parallel to the first straight line.

5. The socket protection device as described in claim 4, wherein the operation rod comprises a connecting portion and a free portion, the connecting portion is secured to an end of one of the first shaft portions away from the second shaft portion, the first shaft portions, the second shaft portion, the connecting portion, and the free portion are coplanar with each other, the second shaft portion is nearer to free portion than the first shaft portions, the free portion is latched by the second latching portion when the cover covers the socket.

6. The socket protection device as described in claim 1, wherein the limiting member comprises a first rod secured to the circuit board and a second rod secured to the first rod, the diameter of the first rod is less than that of the second rod.

7. The socket protection device as described in claim 6, wherein the first latching portion defines a latching slot, the width of the latching slot is greater than the diameter of the first rod but less than the diameter of the second rod.

8. The socket protection device as described in claim 7, wherein the first latching portion comprises two latching blocks, the latching blocks are spaced from each other to form the latching slot.

9. A circuit board assembly comprising:
a circuit board;
a socket mounted on the circuit board;
a fixing member to be secured to the circuit board and adjacent to a sidewall of the socket, the fixing member comprising a pair of first connecting blocks parallel to each other, each of the first connecting blocks defining a first shaft hole;
a cover comprising a first cover rotatably connected to the fixing member, a second cover detachably latched to the first cover, a second connecting block defining a second shaft hole, and a first latching portion and a second latching portion which are arranged opposite to the second connecting block;
a limiting member to be mounted on the circuit board and opposite to the fixing member across the socket; and
an operation member comprising a shaft and an operation rod perpendicular secured to the shaft, the shaft passing through one of the first shaft holes, the second shaft hole, and the other one of the first shaft holes in sequence to rotatably connect the cover to the fixing member;
wherein, when the operation rod is pressed to drive the shaft to rotate, the cover is rotated toward the socket by the rotation of the shaft, when the cover covers the socket, the first latching portion latches the limiting member, and the second latching portion latches the operation rod.

10. The circuit board assembly as described in claim 9, wherein the first cover defines a receiving space extending through the first cover, the first receiving space is to expose the socket when the first cover covers the socket.

11. The circuit board assembly as described in claim 10, wherein the second cover comprises a protection portion and a flange surrounding the protection portion, the protection portion protrudes toward a direction opposite to the first cover to form a recess, the shape of the recess is substantially the same as that of the receiving space.

12. The circuit board assembly as described in claim 11, wherein the shaft comprises two first shaft portions and a second shaft portion arranged between the first shaft portions, the first shaft portions are in a first straight line, and the second shaft portion is in a second straight line parallel to the first straight line.

13. The circuit board assembly as described in claim 12, wherein the operation rod comprises a connecting portion and a free portion, the connecting portion is secured to an end of one of the first shaft portions away from the second shaft portion, the first shaft portions, the second shaft portion, the connecting portion, and the free portion are coplanar with each other, the second shaft portion is nearer to free portion than the first shaft portions, the free portion is latched by the second latching portion when the cover covers the socket.

14. The circuit board assembly as described in claim 9, wherein the limiting member comprises a first rod secured to the circuit board and a second rod secured to the first rod, the diameter of the first rod is less than that of the second rod.

15. The circuit board assembly as described in claim 14, wherein the first latching portion defines a latching slot, the width of the latching slot is greater than the diameter of the first rod but less than the diameter of the second rod.

16. The circuit board assembly as described in claim 15, wherein the first latching portion comprises two latching blocks, the latching blocks are spaced from each other to form the latching slot.

\* \* \* \* \*